(12) United States Patent
Ou et al.

(10) Patent No.: US 7,928,424 B2
(45) Date of Patent: Apr. 19, 2011

(54) NITRIDE-BASED LIGHT-EMITTING DEVICE

(75) Inventors: Chen Ou, Hsinchu (TW); Wen-Hsiang Lin, Hsin-Chu (TW); Shih-Kuo Lai, Hsin-Chu (TW)

(73) Assignee: Epistar Corporation, Science-based Industrial Park, Hsinchu (TW)

( * ) Notice: Subject to any disclaimer, the term of this patent is extended or adjusted under 35 U.S.C. 154(b) by 87 days.

(21) Appl. No.: 12/270,828

(22) Filed: Nov. 13, 2008

(65) Prior Publication Data

US 2009/0127581 A1 May 21, 2009

Related U.S. Application Data

(63) Continuation-in-part of application No. 10/711,567, filed on Sep. 24, 2004, now Pat. No. 7,497,905.

(30) Foreign Application Priority Data

Mar. 11, 2004 (TW) .............................. 93106415 A

(51) Int. Cl.
*H01L 33/00* (2010.01)
(52) U.S. Cl. ............ 257/13; 257/E33.008; 257/E33.072
(58) Field of Classification Search ........................ None
See application file for complete search history.

(56) References Cited

U.S. PATENT DOCUMENTS

| 01 A * | 7/1836 | Ruggles ............................ 295/4 |
|---|---|---|
| 5,122,845 A | 6/1992 | Manabe et al. |
| 5,132,750 A * | 7/1992 | Kato et al. ...................... 257/96 |
| 5,290,393 A * | 3/1994 | Nakamura ..................... 438/509 |
| 5,686,738 A | 11/1997 | Moustakas |
| 5,912,476 A * | 6/1999 | Watanabe et al. .................. 257/94 |
| 5,923,950 A * | 7/1999 | Ishibashi et al. ................. 438/46 |
| 5,990,495 A * | 11/1999 | Ohba ............................... 257/94 |
| 6,048,397 A * | 4/2000 | Endo et al. ....................... 117/89 |
| 6,115,399 A | 9/2000 | Shakuda |
| 6,147,364 A * | 11/2000 | Itaya et al. ....................... 257/76 |
| 6,447,938 B1 * | 9/2002 | Bianchi .......................... 428/698 |
| 6,589,447 B1 * | 7/2003 | Ishizaki et al. .............. 252/501.1 |
| 6,844,246 B2 * | 1/2005 | Nagai et al. ..................... 438/479 |
| 7,390,596 B2 * | 6/2008 | Ishibashi et al. ................... 430/5 |
| 2001/0002048 A1 * | 5/2001 | Koike et al. ....................... 257/80 |
| 2001/0032984 A1 * | 10/2001 | Uchida ............................ 257/84 |
| 2002/0158264 A1 * | 10/2002 | Nakamura et al. ............... 257/94 |
| 2002/0179929 A1 * | 12/2002 | Takahashi et al. .............. 257/184 |
| 2003/0013223 A1 * | 1/2003 | Ramdani et al. ................. 438/46 |
| 2003/0057434 A1 * | 3/2003 | Hata et al. ...................... 257/103 |
| 2003/0062529 A1 * | 4/2003 | Kato et al. ....................... 257/79 |
| 2003/0070607 A1 * | 4/2003 | Koike et al. ..................... 117/84 |
| 2003/0092230 A1 * | 5/2003 | Koike et al. .................... 438/200 |
| 2003/0092263 A1 * | 5/2003 | Koike et al. .................... 438/689 |
| 2003/0119239 A1 * | 6/2003 | Koike et al. .................... 438/200 |

(Continued)

FOREIGN PATENT DOCUMENTS

EP 1111663 6/2001

(Continued)

*Primary Examiner* — David E Graybill
(74) *Attorney, Agent, or Firm* — Winston Hsu; Scott Margo

(57) ABSTRACT

A nitride-based light-emitting device includes a substrate and a plurality of layers formed over the substrate in the following sequence: a nitride-based buffer layer formed by nitrogen, a first group III element, and optionally, a second group III element, a first nitride-based semiconductor layer, a light-emitting layer, and a second nitride-based semiconductor layer.

15 Claims, 11 Drawing Sheets

U.S. PATENT DOCUMENTS

| | | | |
|---|---|---|---|
| 2003/0122478 A1* | 7/2003 | Suehiro et al. | 313/498 |
| 2003/0134446 A1* | 7/2003 | Koike et al. | 438/41 |
| 2003/0155575 A1* | 8/2003 | Shibata et al. | 257/79 |
| 2003/0162340 A1* | 8/2003 | Tezen | 438/184 |
| 2003/0183837 A1* | 10/2003 | Kushibe et al. | 257/101 |
| 2004/0021401 A1* | 2/2004 | Ando | 310/344 |
| 2004/0048448 A1* | 3/2004 | Koike et al. | 438/459 |
| 2004/0087115 A1* | 5/2004 | Nagai et al. | 438/481 |
| 2004/0161006 A1* | 8/2004 | Chang et al. | 372/45 |
| 2004/0161009 A1* | 8/2004 | Edamura et al. | 372/45 |
| 2004/0206949 A1* | 10/2004 | Bour et al. | 257/13 |
| 2004/0261693 A1* | 12/2004 | Lai et al. | 117/86 |
| 2005/0089074 A1* | 4/2005 | Koelle et al. | 372/50 |
| 2005/0221520 A1* | 10/2005 | Ou et al. | 438/29 |
| 2009/0127581 A1* | 5/2009 | Ou et al. | 257/103 |

FOREIGN PATENT DOCUMENTS

| | | | |
|---|---|---|---|
| JP | 53053991 A | * | 5/1978 |
| JP | 61106497 A | * | 5/1986 |
| JP | 2000312032 A | * | 11/2000 |
| JP | 2000332229 A | * | 11/2000 |
| JP | 2003077840 A | * | 3/2003 |
| JP | 2003-309291 | | 10/2003 |
| JP | 2003-338662 | | 11/2003 |

* cited by examiner

|  | Brightness at 20mA (mcd) | Forward bias at 20mA (V) | Leakage current at -5V ($\mu$A) | Reverse voltage at -10 $\mu$A (V) |
|---|---|---|---|---|
| Buffer provided by two-step growth method | 37~40 | 3.14~3.25 | 0.00~0.01 | 24~32 |
| Nitride-based buffer layer provided by the present invention | 38~42 | 3.17~3.24 | 0.00~0.01 | 20~33 |

FIG. 8

NITRIDE-BASED LIGHT-EMITTING DEVICE

CROSS REFERENCE TO RELATED APPLICATIONS

The present application is a continuation-in-part of a pending patent application Ser. No. 10/711,567, filed Sep. 24, 2004.

BACKGROUND OF THE INVENTION

1. Technical Field

The present invention provides a nitride-based light-emitting device, especially a nitride-based light-emitting device including a nitride-based buffer layer.

2. Description of the Related Art

The applications of light-emitting diodes are extensive, such as optical display devices, traffic signals, data storing devices, communication devices, illumination devices, and medical apparatuses. It is important to increase the brightness of light-emitting diodes, and to simplify manufacturing processes in order to decrease the cost of the light-emitting diode.

In general, a conventional nitride-based light-emitting device includes a nitride-based buffer layer composed of group AlGaInN and formed over a sapphire substrate, and a nitride-based epitaxy process is undergone on the nitride-based buffer layer to form a nitride-based light-emitting device. Due to the mismatching of the crystal lattice constants, the dislocation density (which affects the quality of the conventional nitride-based light-emitting device) cannot be decreased efficiently. Therefore, in order to improve the quality of the conventional nitride-based light-emitting device, the conventional nitride-based epitaxy process is mended as a two-step growth method, which utilizes low-temperature (500 to 600° C.) GaN for forming a buffer layer, a heating process (reaching a temperature of 1000 to 1200° C.) for crystallization, and an epitaxy process for each epitaxy stack layer. The thickness and temperature of the buffer layer, the recovery of the heating and re-crystallization processes, plus the ratio and flow rate of gas for each reaction must be controlled precisely, thus the manufacturing process becomes complicated and difficult, and as a consequence manufacturing efficiency cannot be increased.

SUMMARY OF THE DISCLOSURE

A detailed description is given in the following embodiments with reference to the accompanying drawings. An embodiment of a nitride-based light-emitting device is provided. The nitride-based light-emitting device comprises a substrate, a nitride-based buffer layer, a first nitride-based semiconductor layer, a light-emitting layer, and a second nitride-based semiconductor layer. The nitride-based buffer layer is formed over the substrate by nitrogen and at least a first group III element while a second group III element is optionally included. The concentrations of the first group III element, the second group III element, and nitrogen add up to one. The portion of the nitride-based buffer layer close to the substrate has higher concentration of the first group III element than that of the second group III element, and the combined concentration of the first group III element and the second group III element is greater than that of nitrogen. The portion of the nitride-based buffer layer far away from the substrate has a lower concentration of the first group III element than that of the second group III element if the nitride-based buffer layer contains the second group III element. In addition, the nitride-based buffer layer has lower nitrogen concentration close to the substrate and higher nitrogen concentration far away from the substrate. The first nitride-based semiconductor layer is formed over the nitride-based buffer layer. The light-emitting layer is formed over the first nitride-based semiconductor layer, and the second nitride-based semiconductor layer is formed over the light-emitting layer.

In another embodiment, a nitride-based light-emitting device comprising a substrate, a nitride-based buffer layer, a first nitride-based semiconductor layer, a light-emitting layer, and a second nitride-based semiconductor layer is proposed. The nitride-based buffer layer is formed over the substrate by nitrogen and at least a first group III element while a second group III element is optionally included. The nitride-based buffer layer is of a single crystal structure. The first nitride-based semiconductor layer is formed over the nitride-based buffer layer. The light-emitting layer is formed over the first nitride-based semiconductor layer. The second nitride-based semiconductor layer is formed over the light-emitting layer.

BRIEF DESCRIPTION OF THE DRAWINGS

FIG. 8 illustrates a comparison table of blue light-emitting diodes between the present invention and the ones fabricated by the conventional two-step growth method.

DETAILED DESCRIPTION

Figure 1:
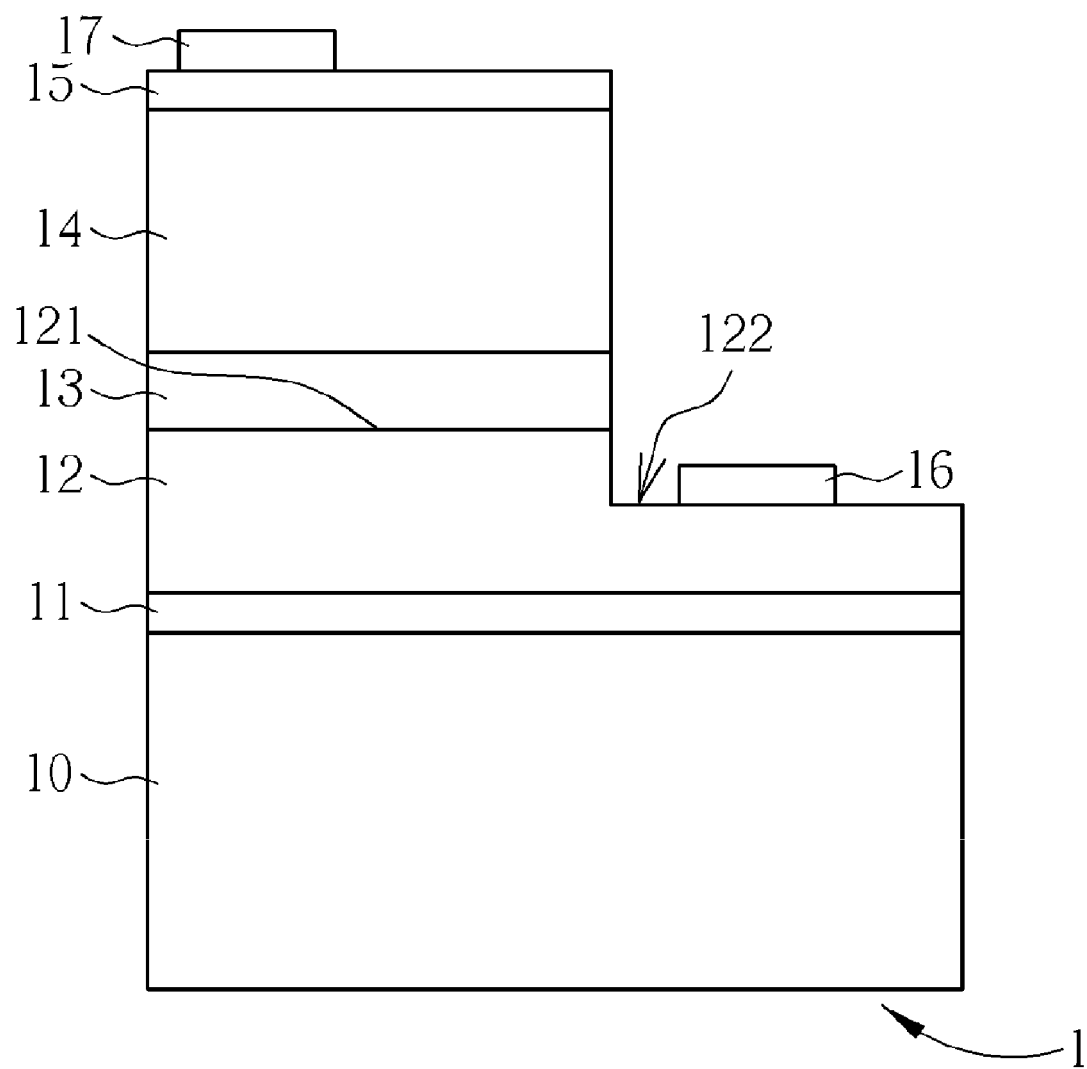
FIG. 1 illustrates a schematic diagram of an embodiment of a nitride-based light-emitting device with a nitride-based buffer layer according to the present invention.

Please refer to FIG. 1, which illustrates a schematic diagram of a nitride-based light-emitting device 1 with an AlGaN buffer layer according to the present invention. The nitride-based light-emitting device 1 includes a sapphire substrate 10, an AlGaN buffer layer 11 formed over the sapphire substrate 10, a nitride-based stack layer 12 made of n-type semiconductor and formed over the AlGaN buffer layer 11 with an epitaxy area 121 and an n-type electrode contact area 122, a multi-quantum well light-emitting layer 13 made of nitride materials like GaN/InGaN formed over the epitaxy area 121, a nitride-based stack layer 14 made of p-type semiconductor and formed over the multi-quantum well light-emitting layer 13, a metallic transparent conductive layer 15 formed over the nitride-based stack layer 14, an n-type electrode 16 formed over the n-type electrode contact area 122, and a p-type electrode 17 formed over the metallic transparent conductive layer 15.

A method for forming the above-mentioned AlGaN buffer layer of the nitride-based light-emitting device 1 is performed according to the following steps:

(a) introducing an Al-contained organometallic reaction source like TMAl at 800° C. for forming an aluminum-rich transient layer;

(b) introducing a Ga-contained organometallic reaction source like TMGa and a nitrogen reaction source NH3 under a lower mole flow ratio (V/III<1000);

(c) raising the growth temperature to 1050° C. and growing a high-temperature GaN layer with a higher mole flow ratio (V/III>2000).

During the growth of GaN layer, the Al atoms of the aluminum-rich transient layer, the Ga atoms, and the N atoms in the region close to the transient layer are re-arranged. The Al atoms are diffused upward and the Ga atoms and N atoms are diffused downward. Hence, the composition of the AlGaN buffer layer changes gradually, and the AlGaN buffer layer is grown as a single crystal structure. The concentrations of the Al, Ga, and N atom add up to one. The portion of the AlGaN buffer layer close to the substrate has higher concentration of the Al atom than that of the Ga atom, and the combined concentration of the Al and Ga atom is greater than that of the N atom. The portion of the AlGaN buffer layer far away from the substrate has a lower concentration of the Al atom than that of the Ga atom. In addition, the AlGaN buffer layer has higher concentration of the N atom far away from the substrate and lower concentration of the N atom close to the substrate. Then, the Al, Ga, and N atoms are bonded together to form an AlGaN buffer layer.

Another method for forming the above-mentioned AlGaN buffer layer of the nitride-based light-emitting device 1 is performed according to the following steps:

(a) introducing an Al-contained organometallic reaction source TMAl at 1020° C. for forming an aluminum-rich transient layer;

(b) introducing a Ga-contained organometallic reaction source TMGa and an nitrogen reaction source NH3 at the same temperature as in step (a) to grow the high-temperature GaN layer.

During the growth of GaN layer, the Al atoms of the aluminum-rich transient layer, the Ga atoms, and the N atoms in the region close to the transient layer are re-arranged. The Al atoms are diffused upwards, and the Ga atoms and N atoms are diffused downwards. Hence, the composition of the AlGaN buffer layer changes gradually, and the AlGaN buffer layer is grown as a single crystal structure. The concentrations of the Al, Ga, and N atom add up to one. The portion of the nitride-based buffer layer close to the substrate has higher concentration of the Al atom than that of the Ga atom, and the combined concentration of the Al and Ga atom is greater than that of the N atom. The portion of the nitride-based buffer layer far away from the substrate has a lower concentration of the Al atom than that of the Ga atom. In addition, the nitride-based buffer layer has higher concentration of the N atom far away from the substrate and lower concentration of the N atom close to the substrate. Then, the Al, Ga and N atoms are bonded together to form the AlGaN buffer layer.

Figure 2:
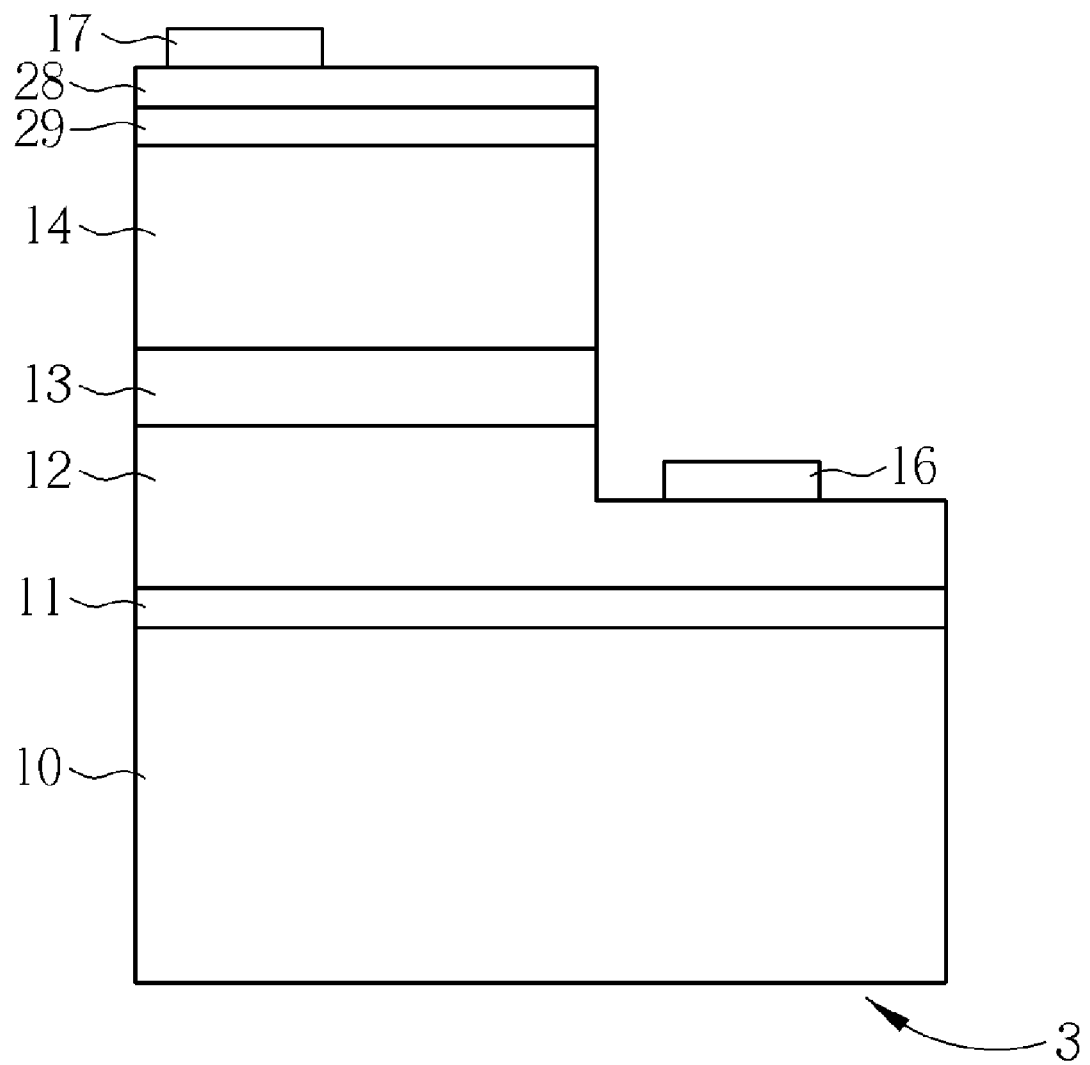
FIG. 2 illustrates a schematic diagram of an embodiment of a nitride-based light-emitting device with a nitride-based buffer layer according to the present invention.

Please refer to FIG. 2, which illustrates a schematic diagram of another embodiment of nitride-based light-emitting device 3 with an AlGaN buffer layer according to the present invention. The most significant difference between the nitride-based light-emitting device 1 and the nitride-based light-emitting device 3 is that a transparent oxide contact layer 28 of the nitride-based light-emitting device 3 is formed over the nitride-based stack layer instead of the metal transparent conductive layer 15 of the nitride-based light-emitting device 1, and a highly-doped n-type reverse tunneling contact layer 29 of the nitride-based light-emitting device 3 with a thickness of less than 10 nm and doping concentration greater than $1\times10^{19}$ cm$^{-3}$ is formed between the nitride-based stack layer 14 and the transparent oxide contact layer 28, so that an ohmic contact is formed between the transparent oxide contact layer 28 and the highly-concentrated n-type reverse tunneling contact layer 29. When the nitride-based light-emitting device 3 is operated in forward bias, the interface between the highly-concentrated n-type reverse tunneling contact layer 29 and the nitride-based stack layer 14 is in the reverse bias mode, and forms a depletion region. In addition, carriers of the transparent oxide contact layer 28 can punch through the nitride-based stack layer 14 because of the tunneling effect, which makes the operating bias of the nitride-based light-emitting device 3 reaching the same level as the conventional LED with a metal transparent conductive layer.

The AlGaN buffer layers of the nitride-based light-emitting devices 1 and 3 can be replaced with other nitride-based buffer layers, such as InGaN and InAlN buffer layers.

Figure 3:
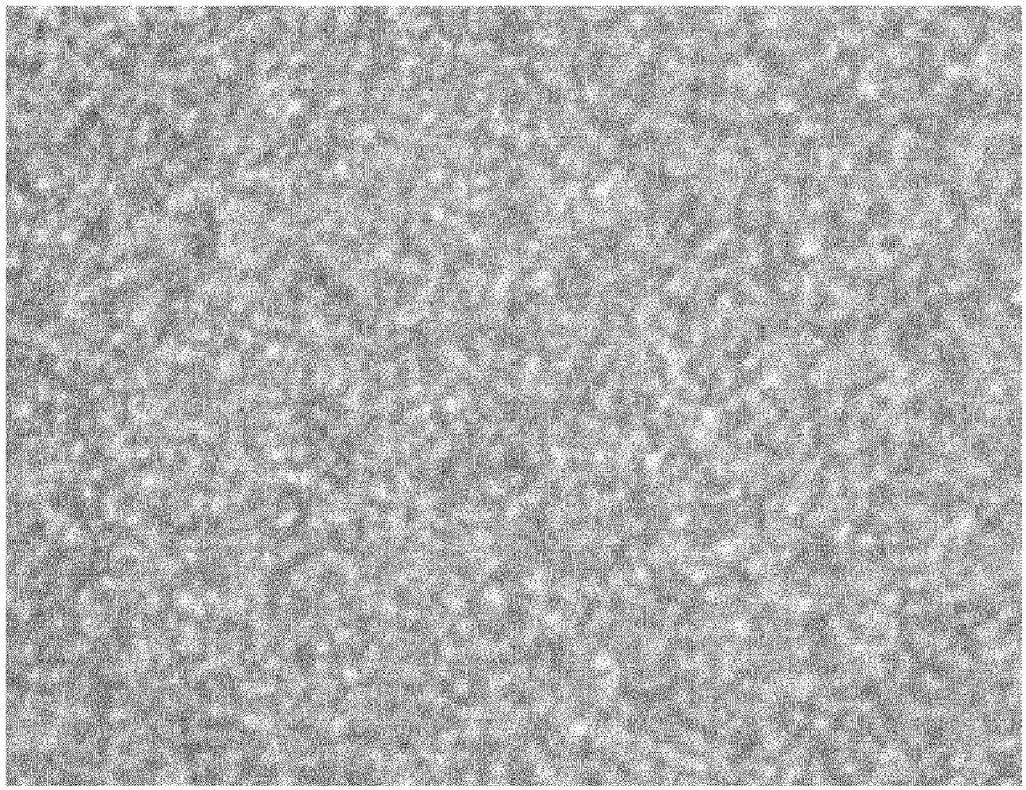
FIG. 3, FIG. 4, and FIG. 5 are photographs illustrating surface morphologies of epi-wafers by an interference optical microscope.
Figure 4:
Figure 5:
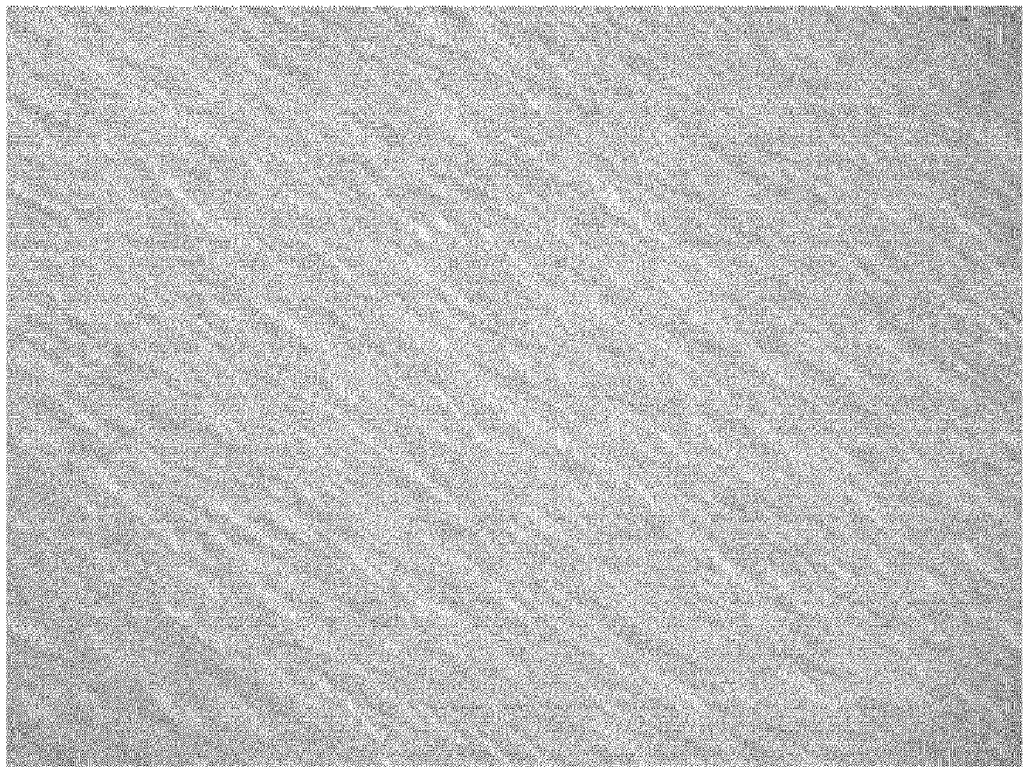

Please refer to FIG. 3, FIG. 4, and FIG. 5, which are photographs illustrating surface morphologies of epi-wafers examined under an interference optical microscope. FIG. 3 shows a surface without any buffer layer; FIG. 4 shows a surface with a conventional GaN buffer layer fabricated by a two-step growth method; FIG. 5 shows a surface of the AlGaN buffer layer of the present invention, on which the GaN layer is grown after a high temperature. The surface without any buffer layer forms a hazy surface indicating that it is a non-single crystalline structure, while the surface of the AlGaN buffer layer of the present invention forms a mirror-like surface similar to that fabricated by a conventional two-step growth method.

Figure 6:
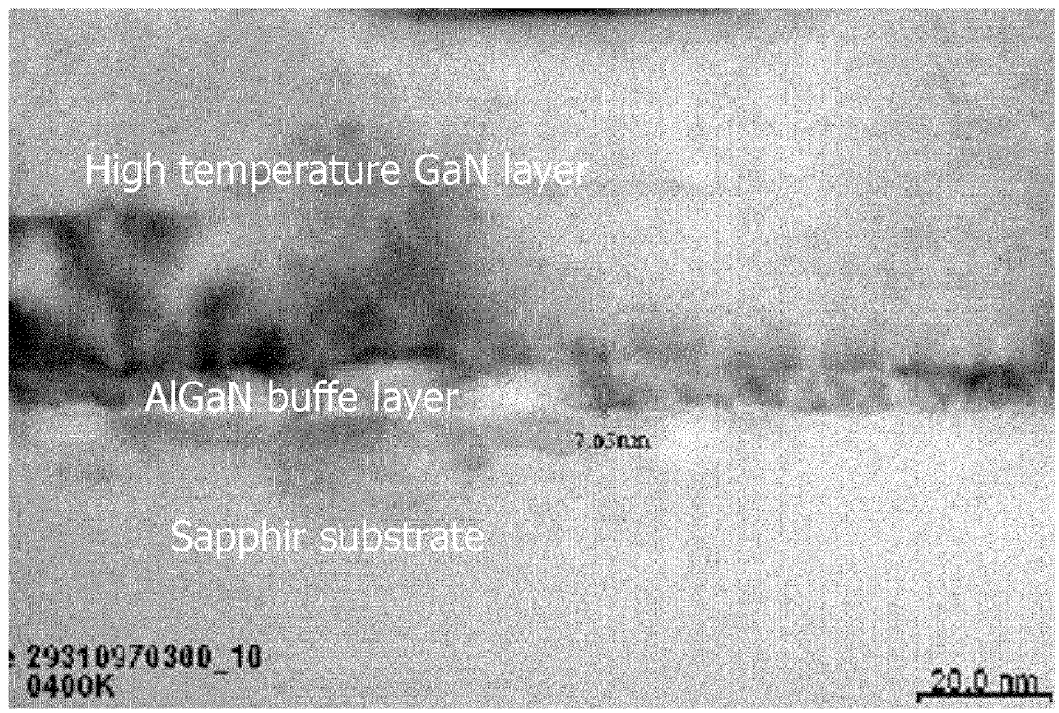
FIG. 6 illustrates a cross section picture shot by a transmission electron microscope.

Furthermore, comparing to other conventional buffer layers which also have mirror-like surfaces, the thickness of the nitride-based buffer layer of the present invention is thinner. Please refer to FIG. 6, which is a cross section picture taken by a transmission electron microscope. It is obviously shown that the thickness of the buffer layer is only around 7 nm, in contrast to a thickness of 20 to 40 nm of a buffer layer derived from the conventional two-step growth method.

Figure 7:
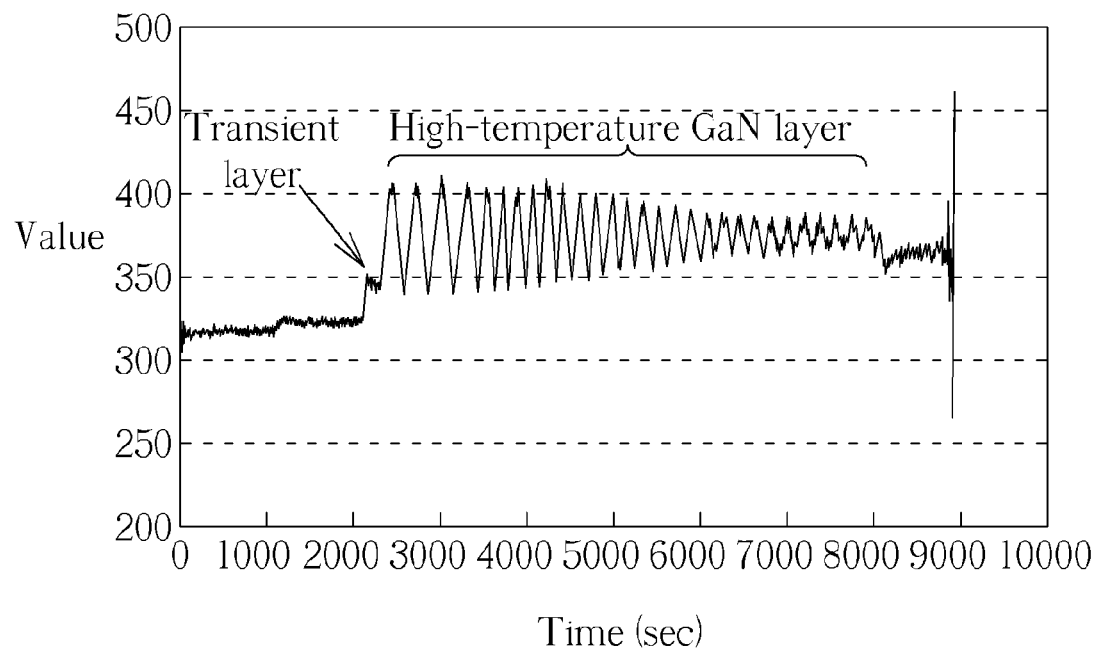
FIG. 7 shows a reflectance spectrum of the present invention by in-situ monitor when growing a slightly Si-doping GaN layer.

Please refer to FIG. 7, which shows a reflectance spectrum of the present invention by in-situ monitor while growing a slightly Si-doping GaN layer. It illustrates signals from forming the transient layer and the following GaN layer in a high temperature. The crystal quality has been characterized by XRC and Hall measurements. The GaN layer of the present invention has a full width at half maximum (FWHM) of XRC of 232 arcsec, and the mobility of Hall carriers can reach as high as 690 cm$^2$/V.s while concentration of Hall carriers being $1\times10^{17}$ cm$^{-3}$. Relatively, the GaN layer fabricate by the conventional two-step growth method has a wider XRC FWHM of 269 arcsec, and a lower mobility of 620 cm$^2$/V.s of Hall carriers under the similar concentration of Hall carriers. It strongly indicates that the crystal quality of the GaN layer of the present invention is significantly improved when compared with the one fabricated by the conventional two-step growth method.

Furthermore, we have made a comparison between a blue light-emitting diode of the present invention and the one fabricated by the two-step growth method. Please refer to FIG. 8 for table 100, which illustrates a comparison between a blue light-emitting diode of the present invention and the one fabricated by the conventional two-step growth method.

From the table 100, it can be seen that in terms of brightness, under a condition of a forward voltage at 20 mA, a leakage current at −5V, and a reverse voltage at −10 μA, a blue light-emitting diode of the present invention are comparable to the one fabricated by the conventional two-step growth method. In addition, the reliability of the blue light-emitting diode of the present invention is also similar to that of the one fabricated by the conventional two-step growth method. Therefore, the present invention provides devices with similar characteristics to those fabricated by the prior art, yet manufactured in a simpler process.

Figure 9:
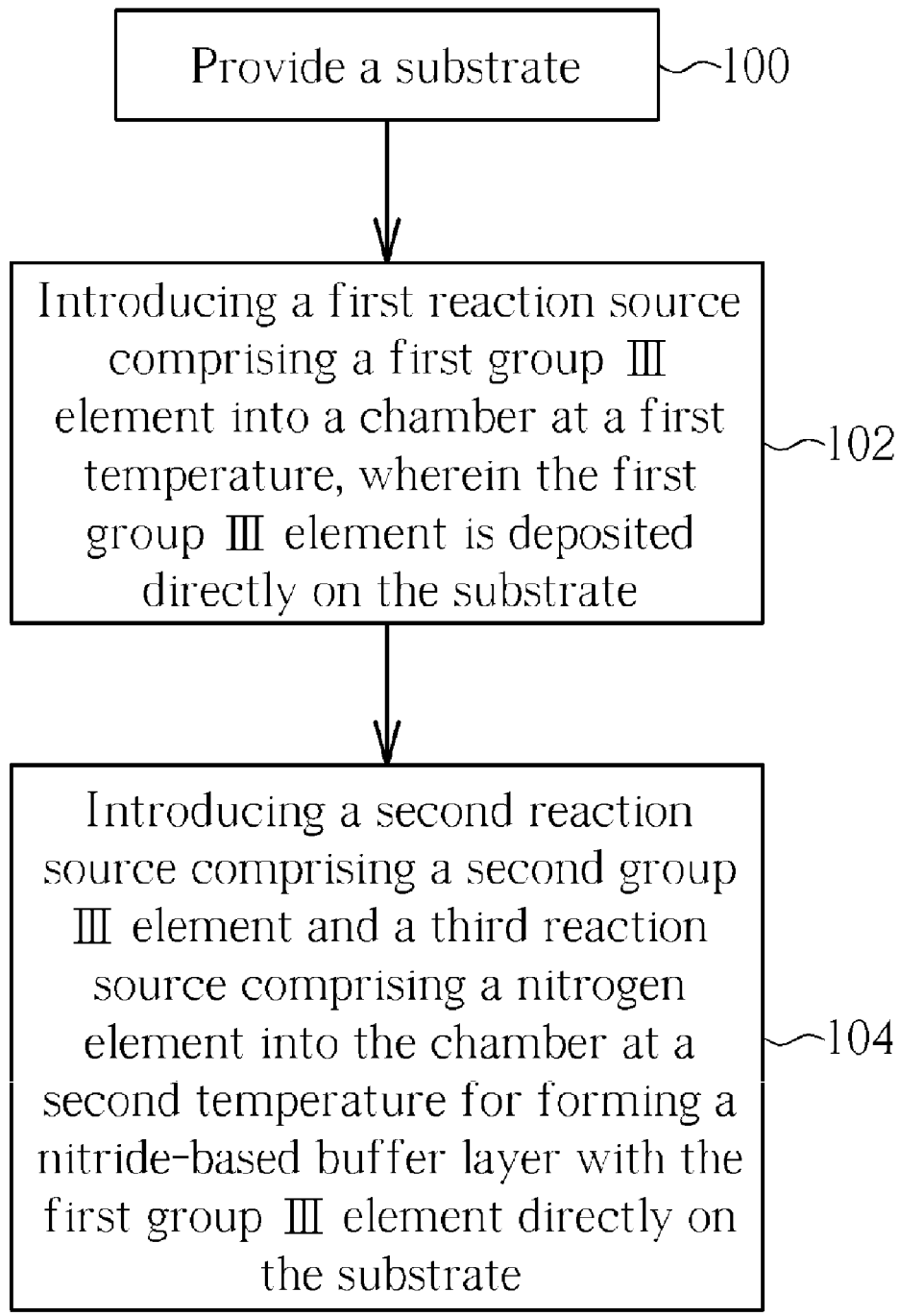
FIG. 9 illustrates a flowchart of summarizing the method of growing an AlGaN buffer layer of the nitride-based light-emitting device according to the present invention.

FIG. 9 shows a flowchart of the method of growing an AlGaN buffer layer of the nitride-based light-emitting device 1 according to an embodiment of the present invention. A substrate is provided in step 100. Next, in step 102, a first reaction source containing a first group III element is introduced into a chamber at a first temperature. The melting point of the first group III element is lower than the first temperature, and the first group III element is deposited directly on the substrate. Then, in step 104, a second reaction source containing a second group III element and a third reaction source containing a nitrogen element are introduced into the chamber at a second temperature for forming a nitride-based buffer layer with the first group III element directly on the substrate. The second temperature is not lower than the melting point of the first group III element.

Figure 10:
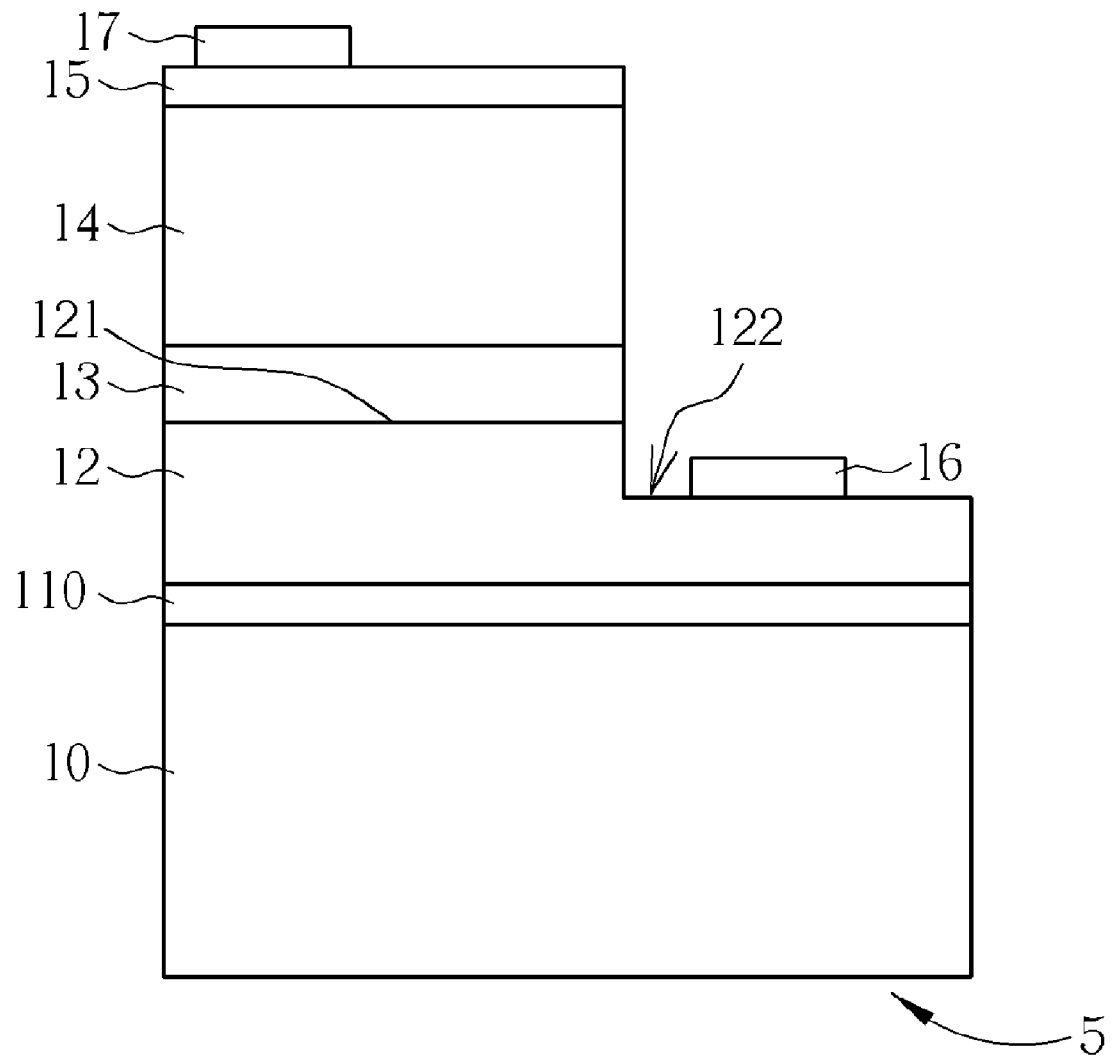
FIG. 10 illustrates a schematic diagram of a nitride-based light-emitting device with an AlN buffer layer according to the present invention.

The present invention provides a third embodiment for illustrating a blue light-emitting diode with a nitride-based buffer layer. Please refer to FIG. 10, which illustrates a schematic diagram of a nitride-based light-emitting device 5 with an AlN buffer layer according to the third embodiment of the present invention. The structure of the nitride-based light-emitting device 5 is the same as the nitride-based light-emitting device 1. The most significant difference between the nitride-based light-emitting device 1 and the nitride-based light-emitting device 5 is that the material of the buffer layer 11 of the nitride-based light-emitting device 5 is AlN. Methods for forming the above-mentioned AlN buffer layer 110 of the nitride-based light-emitting device 5 are given as follows:

Method (A):
(a) introducing an Al-contained organometallic reaction source TMAl at about 800° C. for forming an aluminum-rich transient layer whose thickness is around 2 to 15 nm;
(b) during the period of raising the growth temperature to about 1050° C., introducing the Al-contained organometallic reaction source TMAl continuously and introducing additional nitrogen reaction source NH3 simultaneously under a lower mole flow ratio (V/III<1000) for forming an aluminum-rich AlN layer whose thickness is around 2 to 5 nm;
(c) at the growth temperature of about 1050° C., continuing introducing the Al-contained organometallic reaction source TMAl and the nitrogen reaction source NH3 simultaneously for growing the AlN buffer layer 110 whose thickness is around 3 to 10 nm. Afterwards, at the same or a higher temperature, other layers of the nitride-based light-emitting device 5 are formed.

Method (B):
(a) introducing an Al-contained organometallic reaction source TMAl at about 800° C. for forming an aluminum-rich transient layer whose thickness is around 2 to 15 nm;
(b) during the period of raising the growth temperature to about 1050° C., introducing additional nitrogen reaction source NH3 simultaneously under a lower mole flow ratio (V/III<1000) for forming an aluminum-rich AlN layer whose thickness is around 2 to 10 nm;
(c) at the growth temperature of about 1050° C., stopping introducing the Al-contained organometallic reaction source TMAl and keeping introducing the nitrogen reaction source NH3 for reacting with the aluminum-rich transient layer and the aluminum-rich AlN layer to form the AlN buffer layer 110. Afterwards, at the same or at a higher temperature, other layers of the device 5 are formed.

Method (C):
(a) introducing an Al-contained organometallic reaction source TMAl at about 800° C. for forming an aluminum-rich transient layer whose thickness is around 2 to 15 nm;
(b) raising the growth temperature to about 1050° C., and during the temperature-raising period, stopping introducing the Al-contained organometallic reaction source TMAl and introducing nitrogen reaction source NH3 for reacting with the aluminum-rich transient layer;
(c) at the growth temperature of about 1050° C., reintroducing the Al-contained organometallic reaction source TMAl and continuing introducing the nitrogen reaction source NH3 for growing the AlN buffer layer 110 whose thickness is around 5 to 15 nm. Afterwards, at the same or at a higher temperature, other layers of the device 5 are formed.

Method (D):
(a) introducing an Al-contained organometallic reaction source TMAl at about 1020° C. for forming an aluminum-rich transient layer whose thickness is around 2 to 15 nm;
(b) continuing introducing Al-contained organometallic reaction source TMAl and introducing additional nitrogen reaction source NH3 with a lower mole flow ratio (V/III<500) for forming an aluminum-rich AlN layer whose thickness is around 2 to 10 nm;
(c) at the growth temperature of about 1020° C., stopping introducing the Al-contained organometallic reaction source TMAl and continuing introducing the nitrogen reaction source NH3 for reacting with the aluminum-rich transient layer and the aluminum-rich AlN layer to form the AlN buffer layer 110. Afterwards, at the same or at a higher temperature, other layers of the device 5 are formed.

Method (E):
(a) introducing an Al-contained organometallic reaction source TMAl at about 1020° C. for forming an aluminum-rich transient layer whose thickness is around 2 to 15 nm;
(b) continuing introducing the Al-contained organometallic reaction source TMAl and introducing additional nitrogen reaction source NH3 simultaneously with a lower mole flow ratio (V/III<500) for forming an aluminum-rich AlN layer whose thickness is around 2 to 5 nm;
(c) at the growth temperature of about 1020° C., continuing introducing the Al-contained organometallic reaction source TMAl and the nitrogen reaction source NH3, and increasing the flow of NH3 to raise the mole flow ratio to more than 1000 (V/III>1000) for growing the AlN buffer layer 110 whose thickness is around 3 to 10 nm. Afterwards, at the same or a higher temperature, other layers of the device 5 are formed.

Method (F):
(a) introducing an Al-contained organometallic reaction source TMAl at about 1080° C. for forming an aluminum-rich transient layer whose thickness is around 2 to 15 nm;
(b) stopping introducing the Al-contained organometallic reaction source TMAl, and lowering the growth temperature to about 1040° C. During the lowering period, introducing additional nitrogen reaction source NH3 for reacting with the aluminum-rich transient layer to form an aluminum-rich AlN layer;
(c) at the growth temperature at about 1040° C., continuing introducing the Al-contained organometallic reaction source TMAl and the nitrogen reaction source NH3 simultaneously, and increasing the flow of NH3 to raise the mole flow ratio to more than 1000 (V/III>1000) for growing the AlN buffer layer 110 whose thickness is around 3 to 10 nm. Afterwards, at the same temperature of about 1040° C. or at a higher temperature between 1040° C. and 1080° C., other layers of the device 5 are formed.

During the growth of AlN layer, the Al atoms of the aluminum-rich transient layer and the N atoms in the region close to the transient layer are re-arranged. The Al atoms are diffused upwards and N atoms are diffused downwards. The Al atoms are introduced before the nitrogen atom, hence, the composition of the AlN buffer layer changes gradually, and the AlN buffer layer is grown as a single crystal structure. When forming the aluminum-rich transient layer, the temperature for forming the aluminum-rich transient layer is higher than the melting point of the Al atom to prevent a pure Al layer from being formed within the AlN buffer layer. So is the temperature for forming the AlN buffer layer. The pure Al layer is opaque and results in low efficiency in light-emitting, and concerns the epitaxy process of the following layers. The portion of the AlN buffer layer close to the substrate has higher concentration of the Al atom than that of the N atom; the AlN buffer layer has higher concentration of the N atom far away from the substrate and lower concentration of the N atom close to the substrate.

Figure 11:
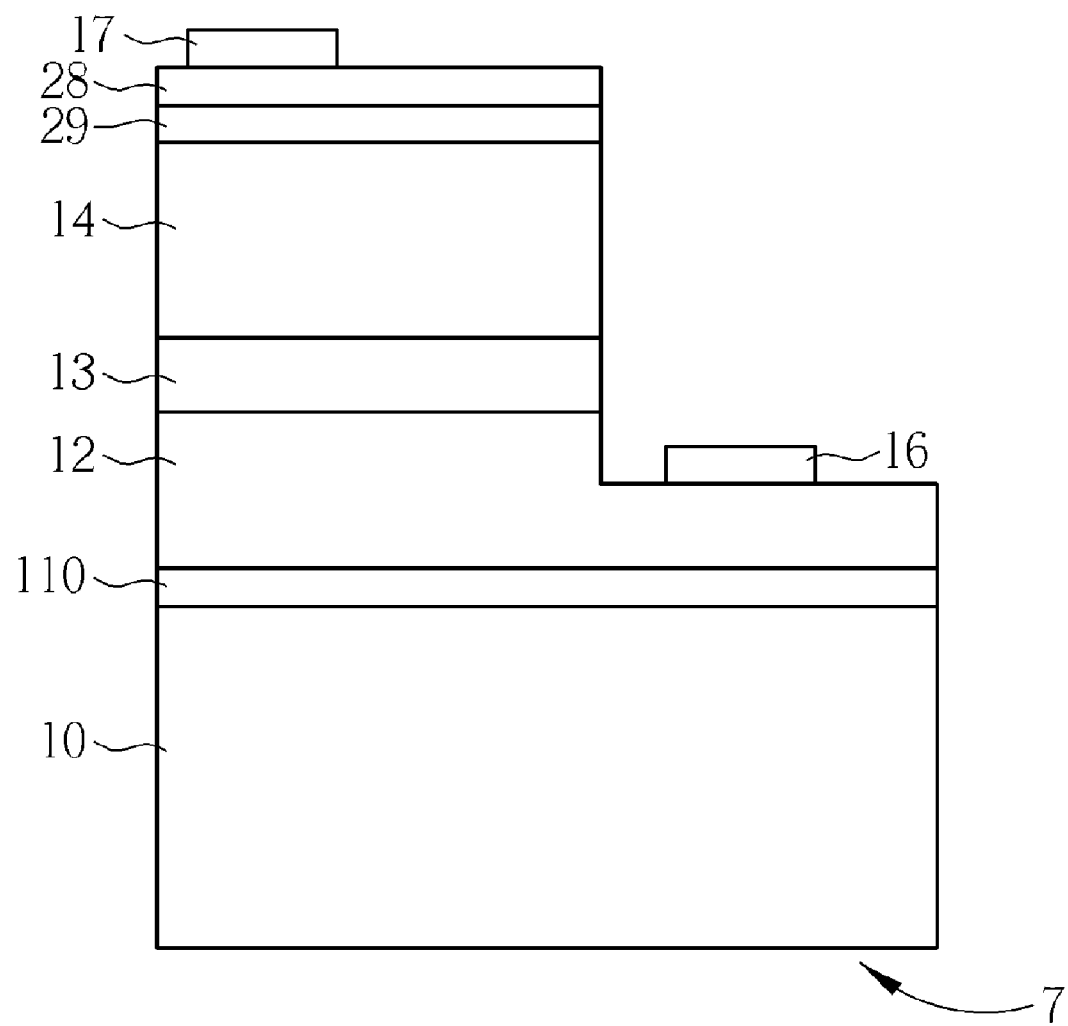
FIG. 11 illustrates a schematic diagram of a fourth embodiment of a nitride-based light-emitting device with an AlN buffer layer according to the present invention.

Please refer to FIG. 11, which illustrates a schematic diagram of a nitride-based light-emitting device 7 with an AlN buffer layer according to a fourth embodiment of the present invention. The structure of the nitride-based light-emitting device 7 is the same as the nitride-based light-emitting device 3. The most significant difference between the nitride-based light-emitting device 3 and the nitride-based light-emitting device 7 is that the material of the buffer layer 11 of the nitride-based light-emitting device 7 is AlN.

In addition, the AlN buffer layers of the nitride-based light-emitting devices 5 and 7 can be replaced with other binary nitride-based buffer layers, such as GaN and InN buffer layers.

In the nitride-based light-emitting devices 1 and 5, a transparent oxide contact layer can be formed over the nitride-based stack layer instead of the metal transparent metal conductive layer of the nitride-based light-emitting device 1 for increasing light-emitting efficiency owing to the higher light transmittance of the transparent oxide contact layer.

In the above-mentioned embodiments, the nitride-based stack layer made of p-type semiconductor further comprises a p-type nitride-based contact layer and a p-type nitride-based cladding layer, while the nitride-based stack layer made of n-type semiconductor further comprises an n-type nitride-based contact layer and an n-type nitride-based cladding layer. The p-type or n-type nitride-based contact layer and the p-type or n-type nitride-based cladding layer each includes a material selected from a material group consisting of AlN, GaN, InN, AlGaN, AlInN, InGaN, and AlInGaN, or other substitute materials. Besides sapphire, the substrate can be made of other material selected from a group consisting of SiC, GaAs, GaN, AlN, GaP, Si, ZnO, MgO, MgAl2O4, and glass, or other substitute materials. The nitride-based stack layer made of n-type or p-type semiconductor includes a material selected from a group consisting of AlN, GaN, InN, AlGaN, AlInN, InGaN, and AlInGaN, or other substitute materials. The nitride-based multi-quantum well light-emitting layer includes a material selected from a group consisting of AlN, GaN, InN, AlGaN, InGaN, AlInN, and AlInGaN or other substitute materials. The metal contact layer includes a material selected from a group consisting of Ni/Au, NiO/Au, Ta/Au, TiWN, and TiN, or other substitute materials. The transparent oxide contact layer includes a material selected from a group consisting of indium tin oxide, cadmium tin oxide, antimony tin oxide, zinc aluminum oxide, and zinc tin oxide, or other substitute materials.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light-emitting device comprising:
   a substrate;
   a buffer layer formed over the substrate comprising nitrogen and a group III element, wherein an atomic concentration of the group III element is greater than an atomic concentration of nitrogen, and a first portion of the buffer layer adjacent to the substrate comprises an atomic concentration of nitrogen lower than an atomic concentration of nitrogen of a second portion located on the first portion of the buffer layer;
   a first semiconductor layer formed over the buffer layer;
   a multi-quantum well light-emitting structure formed over the first semiconductor layer; and
   a second semiconductor layer formed over the multi-quantum well light-emitting structure.

2. The light-emitting device of claim 1, wherein the substrate comprises a material selected from the group consisting of sapphire, GaN, AlN, SiC, GaAs, GaP, Si, ZnO, MgO, MgAl$_2$O$_4$, and glass.

3. The light-emitting device of claim 1, wherein the first semiconductor layer is of a single crystal structure and comprises a material selected from the group consisting of AlN, GaN, InN, AlGaN, InGaN, AlInN, and AlInGaN.

4. The light-emitting device of claim 1, wherein a melting point of the group III element is lower than a forming temperature of the first semiconductor layer.

5. The light-emitting device of claim 1, wherein the group III element comprises a material selected from the group consisting of Al, Ga, and In.

6. The light-emitting device of claim 1, wherein a thickness of the buffer layer is between 1 nm and 500 nm.

7. The light-emitting device of claim 1, wherein the buffer layer comprises a material selected from the group consisting of AlN, GaN, InN, InGaN, AlGaN InAlN, and AlInGaN.

8. The light-emitting device of claim 1, wherein the buffer layer is of a single crystal structure.

9. A light-emitting device comprising:
   a substrate;
   a buffer layer formed over the substrate comprising nitrogen and a group III element, wherein the buffer layer is of a single crystal structure;

a first semiconductor layer formed over the buffer layer;
a multi-quantum well light-emitting structure formed over the first semiconductor layer; and
a second semiconductor layer formed over the multi-quantum well light-emitting structure.

10. The light-emitting device of claim 9, wherein the substrate comprises a material selected from the group consisting of sapphire, GaN, AlN, SiC, GaAs, GaP, Si, ZnO, MgO, MgAl$_2$O$_4$, and glass.

11. The light-emitting device of claim 9, wherein a melting point of the group III element is lower than a forming temperature of the first semiconductor layer.

12. The light-emitting device of claim 9, wherein the group III element comprises a material selected from the group consisting of Al, Ga, and In.

13. The light-emitting device of claim 9, wherein a thickness of the buffer layer is between 1 nm and 500 nm.

14. The light-emitting device of claim 9, wherein the buffer layer comprises a material selected from the group consisting of AlN, GaN, InN, InGaN, AlGaN InAlN, and AlInGaN.

15. The light-emitting device of claim 9, wherein an atomic concentration of the group III element is greater than an atomic concentration of nitrogen, and a first portion of the buffer layer adjacent to the substrate comprises an atomic concentration of nitrogen lower than an atomic concentration of nitrogen of a second portion of the buffer layer located on the first portion of the buffer layer.

* * * * *